US011869746B2

United States Patent
Matsumoto et al.

(12)

(10) Patent No.: US 11,869,746 B2
(45) Date of Patent: Jan. 9, 2024

(54) MULTI-BEAM WRITING METHOD AND MULTI-BEAM WRITING APPARATUS

(71) Applicant: NuFlare Technology, Inc., Yokohama (JP)

(72) Inventors: Hiroshi Matsumoto, Yokohama (JP); Yasuo Kato, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 12 days.

(21) Appl. No.: 16/929,395

(22) Filed: Jul. 15, 2020

(65) Prior Publication Data
US 2021/0027987 A1    Jan. 28, 2021

(30) Foreign Application Priority Data

Jul. 25, 2019    (JP) .................................. 2019-137074

(51) Int. Cl.
*H01J 37/317*    (2006.01)
*H01J 37/304*    (2006.01)

(52) U.S. Cl.
CPC ...... *H01J 37/3177* (2013.01); *H01J 37/3045* (2013.01); *H01J 2237/30461* (2013.01); *H01J 2237/31764* (2013.01)

(58) Field of Classification Search
CPC ....... H01J 37/00–32422; H10J 37/3177; H10J 37/3026; H10J 37/3045; H10J 37/304;
(Continued)

(56) References Cited

U.S. PATENT DOCUMENTS 8,222,621 B2     7/2012  Fragner et al.
8,502,174 B2 *   8/2013  Wieland ................. B82Y 40/00
                                             250/492.22
(Continued)

FOREIGN PATENT DOCUMENTS

CN        102598199 A     7/2012
JP      2004-303794 A    10/2004
(Continued)

OTHER PUBLICATIONS

Combined Taiwanese Office Action and Search Report dated Jul. 28, 2021 in Taiwanese Patent Application No. 109124900 (with unedited computer generated English translation), 5 pages.
(Continued)

*Primary Examiner* — David E Smith
(74) *Attorney, Agent, or Firm* — Oblon, McClelland, Maier & Neustadt, L.L.P.

(57) ABSTRACT

In one embodiment, a multi-beam writing method is for irradiating each of pixels defined on a substrate, placed on a stage, with each beam of a multi-beam to form a pattern. The method includes obtaining a position correction amount of the pattern by each of a plurality of sub-arrays into which an array of the multi-beam is divided at least in a predetermined direction, based on the positional deviation amount of each beam of each of the sub-arrays, which obtained by dividing an array of the multi-beam at least in the predetermined direction, calculating a dose of the each beam irradiated to each pixel for shifting the position of the pattern drawn for each of the sub-arrays based on the position correction, and performing multi-writing using at least a portion of each two or more of the sub-arrays with the calculated dose.

17 Claims, 10 Drawing Sheets

(58) Field of Classification Search
CPC ... H10J 2237/31769; H10J 2237/30461; H10J 2237/31764
USPC .................................................. 250/492.2
See application file for complete search history.

(56) References Cited

U.S. PATENT DOCUMENTS

| | | | | |
|---|---|---|---|---|
| 8,710,467 | B2* | 4/2014 | Yoshikawa | ......... H01L 21/2633 |
| | | | | 250/492.22 |
| 2004/0188636 | A1 | 9/2004 | Hosoda et al. | |
| 2015/0206709 | A1* | 7/2015 | Nakayamada | ...... H01J 37/3177 |
| | | | | 250/491.1 |
| 2016/0086764 | A1 | 3/2016 | Iizuka et al. | |
| 2016/0155610 | A1 | 6/2016 | Kawana et al. | |
| 2016/0181062 | A1 | 6/2016 | Kato et al. | |
| 2017/0229280 | A1 | 8/2017 | Kato et al. | |
| 2018/0122616 | A1* | 5/2018 | Nishimura | ............ H01J 37/304 |
| 2018/0138013 | A1 | 5/2018 | Iizuka et al. | |
| 2018/0307144 | A1 | 10/2018 | Kato et al. | |
| 2020/0043701 | A1 | 2/2020 | Matsumoto | |

FOREIGN PATENT DOCUMENTS

| | | |
|---|---|---|
| JP | 2016-063149 A | 4/2016 |
| JP | 2016-103557 A | 6/2016 |
| JP | 2016-119423 A | 6/2016 |
| JP | 2017-143235 A | 8/2017 |
| JP | 2018-078251 A | 5/2018 |
| JP | 2018-182189 A | 11/2018 |
| JP | 2020-021919 A | 2/2020 |
| TW | 201738663 A | 11/2017 |

OTHER PUBLICATIONS

Combined Chinese Office Action and Search Report dated Feb. 11, 2023, in corresponding Chinese Patent Application No. 202010722441.8 (with English Translation and English Translation of Category of Cited Documents) 14 pages.

* cited by examiner

MULTI-BEAM WRITING METHOD AND MULTI-BEAM WRITING APPARATUS

CROSS REFERENCE TO RELATED APPLICATION

This application is based upon and claims benefit of priority from the Japanese Patent Application No. 2019-137074, filed on Jul. 25, 2019, the entire contents of which are incorporated herein by reference.

FIELD

The present invention relates to a multi-beam writing method and a multi-beam writing apparatus.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

A writing apparatus that uses a multi-beam can irradiate with many beams at one time, as compared with when writing is performed with a single electron beam, thus the throughput can be significantly improved. In a multi-beam writing apparatus using a blanking aperture array, as an embodiment of the multi-beam writing apparatus, for example, an electron beam discharged from an electron gun passes through a shaping aperture array having multiple openings, and forms a multi-beam (multiple electron beams). The multi-beam passes through the corresponding later-described blankers of the blanking aperture array. The blanking aperture array has electrode pairs for individually deflecting the beams, and an opening for beam passage is formed between each electrode pair. Blanking control on a passing electron beam is performed by controlling the electrode pair (blanker) at the same potential or at different potentials. An electron beam deflected by the blanker is shielded, and an electron beam not deflected by the blanker is emitted to a substrate. Pixels are defined at a constant pitch on the substrate, and a pattern is drawn by exposing the pixels with a multi-beam.

In the multi-beam writing, a beam irradiation position is displaced due to distortion of the lens of the electron optical system, and it is technically difficult to provide a large number of multi-beams with individual deflection units and correct position displacement individually. Thus, even when irradiation is made by a beam with a displaced position, it is possible to eliminate the effect of beam position displacement on a dose distribution applied to a resist by modulating a dose for each beam. This method is called dose modulation between adjacent pixels. This technique is disclosed, for example, in Japanese Unexamined Patent Application Publication No. 2016-119423.

However, when such dose modulation between adjacent pixels is used, a maximum value of the dose for pixel is increased, and the cycle of multi-beam irradiation operation is lengthened, thereby causing a problem that the writing throughput is degraded.

DETAILED DESCRIPTION

In one embodiment, a multi-beam writing method is for irradiating each of pixels defined on a substrate, placed on a stage, with each beam of a multi-beam to form a pattern. The method includes obtaining a position correction amount of the pattern by each of a plurality of sub-arrays into which an array of the multi-beam is divided at least in a predetermined direction, based on the positional deviation amount of each beam of each of the sub-arrays, which obtained by dividing an array of the multi-beam at least in the predetermined direction, calculating an dose of the each beam irradiated to each pixel for shifting the position of the pattern drawn for each of the sub-arrays based on the position correction, and performing multi-writing using at least a portion of each two or more of the sub-arrays with the calculated dose.

Hereinafter, the embodiment of the present invention will be described based on the drawings. In the embodiment, a configuration using an electron beam as an example of a beam will be described. However, the beam is not limited to the electron beam, and may be a beam using a charged particle beam such as an ion beam, or a laser light.

Figure 1:
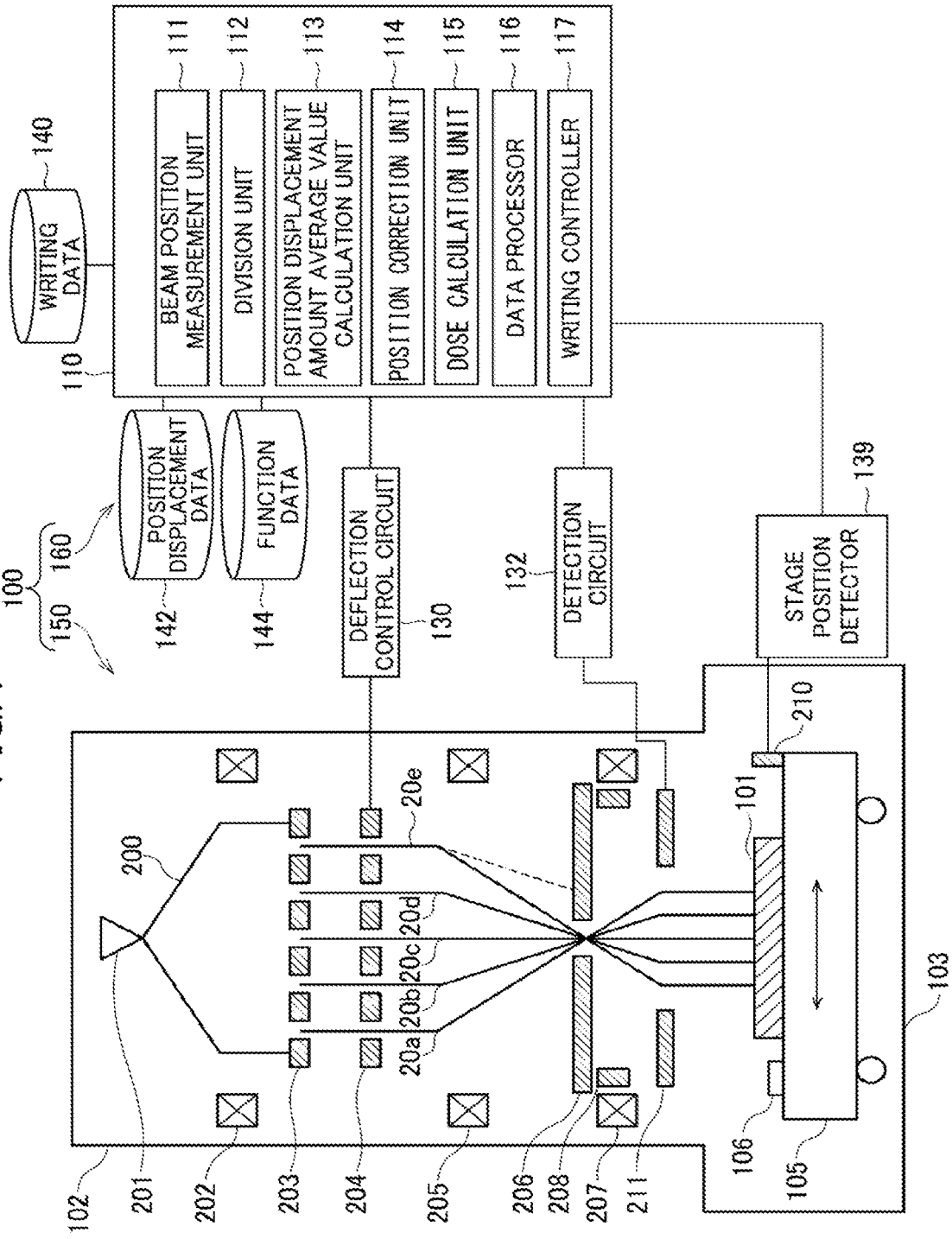
FIG. 1 is a schematic diagram of a multi charged particle beam writing apparatus according to an embodiment of the present invention.

FIG. 1 is a schematic configuration diagram of a writing apparatus according to the embodiment. As shown in FIG. 1, a writing apparatus 100 includes a writer 150 and a controller 160. The writing apparatus 100 is an example of a multi charged particle beam writing apparatus. The writer 150 includes an electron column 102 and a writing chamber 103. In the electron column 102, an electron gun 201, an illuminating lens 202, a shaping aperture member 203, a blanking plate 204, a reducing lens 205, a limiting aperture member 206, an objective lens 207, a deflector 208, and a detector 211 are disposed.

An XY stage 105 is placed in the writing chamber 103. A substrate 101 as a writing target is placed on the XY stage 105. A resist, which is irradiated with a charged particle beam, is coated on the upper surface of the substrate 101. The substrate 101 is, for example, a substrate (mask blanks)

which is processed as a mask or a semiconductor substrate (silicon wafer) which is processed as a semiconductor device. Also, the substrate 101 may be a mask blanks which is coated with a resist, and on which nothing is written.

On the XY stage 105, a mark 106, and a mirror 210 for stage position measurement are disposed.

The controller 160 has a control computer 110, a deflection control circuit 130, a detection circuit 132, a stage position detector 139, and memories 140, 142, 144. Writing data is inputted from the outside to and stored in the memory 140.

The control computer 110 has a beam position measurement unit 111 (a beam position measurer), a division unit 112 (a divider), a position displacement amount average value calculation unit 113 (a position displacement amount average value calculator), a position correction unit 114 (a position corrector), a dose calculation unit 115 (a dose calculator), a data processor 116, and a writing controller 117. Each component of the control computer 110 may be comprised of hardware, such as an electrical circuit, or may be comprised of software, such as a program, which implements these functions. Alternatively, the component may be comprised of a combination of hardware and software.

The stage position detector 139 emits a laser, receives reflection light from the mirror 210, and detects the position of the XY stage 105 by the principle of laser interferometry.

Figure 2:
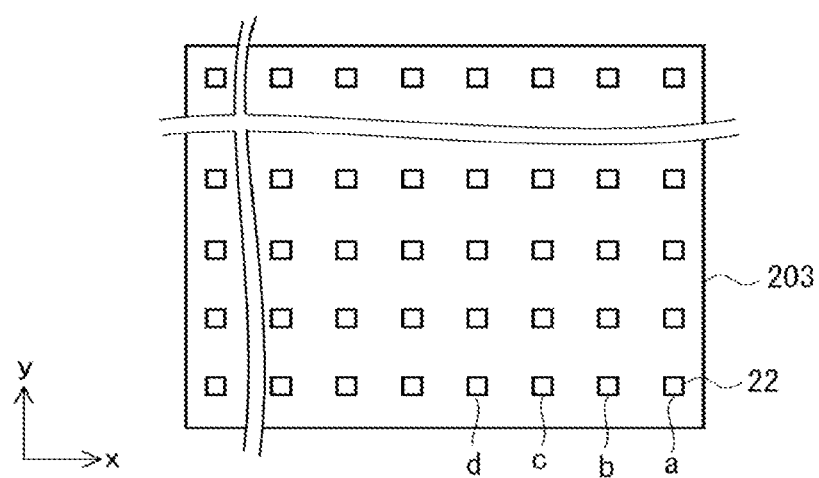
FIG. 2 is a plan view of a shaping aperture member.

FIG. 2 is a conceptual diagram showing the configuration of the shaping aperture member 203. As shown in FIG. 2, in the shaping aperture member 203, openings 22 with m vertical (y direction) rows×n horizontal (x direction) columns (m, n≥2) are formed with a predetermined arrangement pitch. The openings 22 are formed of rectangles in the same dimensional shape, for example. The openings 22 may be circles with substantially the same diameter.

An electron beam 200 discharged from the electron gun 201 (discharge unit) illuminates the entire shaping aperture member 203, for example, substantially perpendicularly by the illuminating lens 202. The electron beam 200 illuminates a region including all the openings 22. Part of the electron beam 200 passes through the multiple openings 22 of the shaping aperture member 203, and the rest of the beam is blocked by the shaping aperture member. The passing of the electron beam 200 through the multiple openings 22 of the shaping aperture member 203 forms multiple electron beams (multi-beams) 20a to 20e in a rectangular shape, for example.

In the blanking plate 204 which is the dose controller, beam passage holes are formed according to the arrangement positions of the openings 22 of the shaping aperture member 203. A set (blanker) of two electrodes as a pair is disposed at each passage hole. An electron beam which passes through each passage hole is independently controlled to be in a beam-on or beam-off state for each beam by a voltage applied to the blanker. In the case of beam-on, the opposing electrodes of a blanker are controlled at the same potential, and the blanker does not deflect the beam. In the case of beam-off, the opposing electrodes of a blanker are controlled at different potentials, and the blanker deflects the beam. In this manner, multiple blankers perform blanking deflection on corresponding beams among the multi-beams which have passed through the multiple openings 22 of the shaping aperture member 203, thereby controlling the beams at a beam-off state.

The multi-beams 20a to 20e which have passed through the blanking plate 204 are reduced by the reducing lens 205.

Here, a beam controlled in a beam-off state is deflected by a blanker of the blanking plate 204 to move along a trajectory outside the opening of the limiting aperture member 206, thus is blocked by the limiting aperture member 206. On the other hand, a beam controlled in a beam-on state is not deflected by a blanker, thus passes through the opening of the limiting aperture member 206. At this point, ideally, the beam passes through the same point. The trajectory of the beam is adjusted by an alignment coil (not illustrated) so that the point is located in an opening at the center of the limiting aperture member 206. In this manner, on/off of a beam is controlled by blanking control of the blanking plate 204. That is, the dose is controlled by controlling the irradiation time by the blanking plate 204.

The limiting aperture member 206 blocks the beams which are deflected so as to be in a beam-off state by multiple blankers. The multi-beam for one shot is formed by the beam which has passed through the limiting aperture member 206 and is formed in a period from beam-on until beam-off is achieved.

A multi-beam which has passed through the limiting aperture member 206 is focused by the objective lens 207, and projected on the substrate 101 with a desired reduction ratio. The entire multi-beam is collectively deflected in the same direction by the deflector 208, and a desired position on the substrate 101 is irradiated with the multi-beam.

When the XY stage 105 is continuously moved, the trajectory of a beam is controlled by the deflector 208 so that the irradiation position of the beam on the substrate 101 follows the movement of the XY stage 105. The multi-beams 20 for irradiation are ideally arranged on the substrate 101 with the pitch which is the product of the arrangement pitch of the multiple openings of the shaping aperture member 203 and the above-mentioned desired reduction ratio. For example, the writing apparatus 100 performs a writing operation by a raster scan method for irradiating with a shot beam sequentially, and when a desired pattern is written, an unnecessary beam is controlled at a beam-off by the blanking control.

Figure 3A:
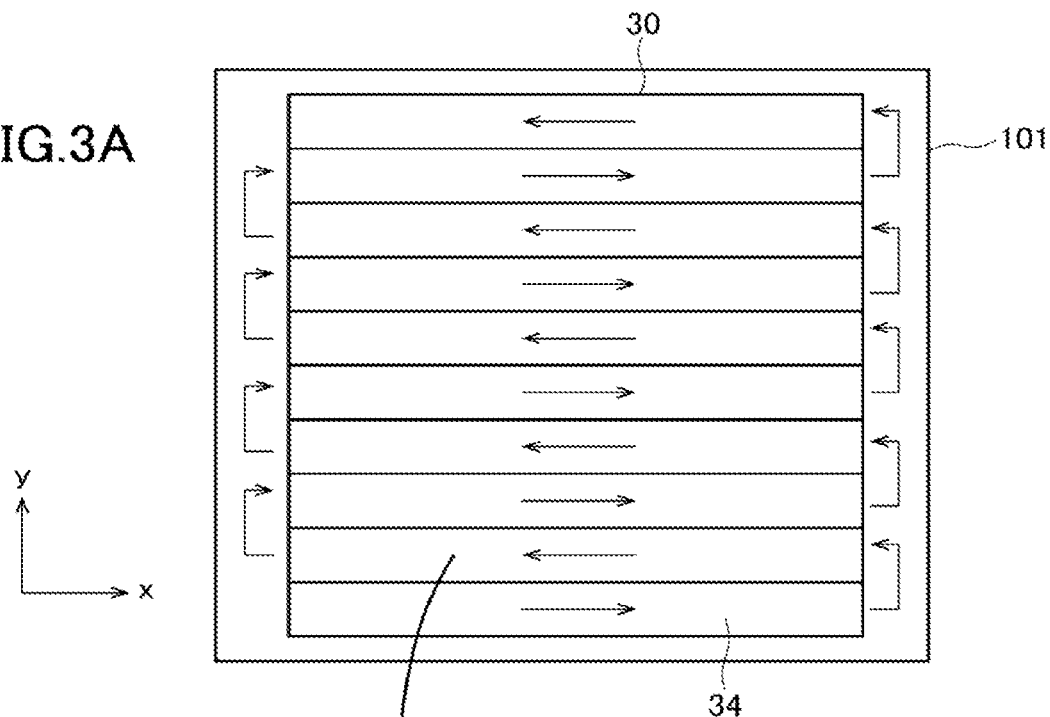
FIG. 3A and FIG. 3B are views illustrating an example of a writing operation.

FIG. 3A is a conceptual view illustrating a writing operation in the embodiment. As shown in FIG. 3A, a writing region 30 on the substrate 101 is divided into multiple rectangular stripe regions 34 with a predetermined width in the y direction (first direction). First, the XY stage 105 is moved, an irradiation region 35 which can be irradiated with a multi-beam for one time is adjusted to be located at the left end of the first stripe region 34, and writing is started.

Figure 3B:
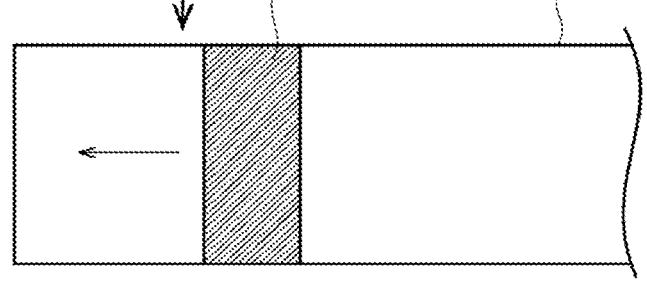

When writing is performed on the first stripe region 34, the writing proceeds relatively in +x direction by moving the XY stage 105 in −x direction. The XY stage 105 is continuously moved at a predetermined speed. After the writing on the first stripe region 34 is performed, the stage position is moved in −y direction so that the irradiation region 35 is adjusted to be located at the right end of the second stripe region 34. Subsequently, as shown in FIG. 3B, the writing is performed in −x direction by moving the XY stage 105 in +x direction.

In the third stripe region 34, the writing is performed in +x direction, and in the fourth stripe region 34, the writing is performed in −x direction. The writing time can be reduced by performing the writing while changing the direction alternately. The writing may be performed on each of the stripe regions 34 in the same direction.

Pixels (not shown) are defined in each stripe region 34, and each stripe region is drawn by exposing each pixel the same number of times using a multi-beam. When writing is performed on each of the stripe region 34, concurrently with the continuous movement of the XY stage 105 in the x direction, the beam position is controlled by the deflector 208 so that the pixels on the substrate 101 are irradiated. At this time, the deflector 208 performs a deflection operation of switching the pixels irradiated are switched between one irradiation and the next irradiation, and performs continuous deflection operation according to the stage movement so that the beam position on the substrate 101 is fixed during the irradiation.

Figure 4:
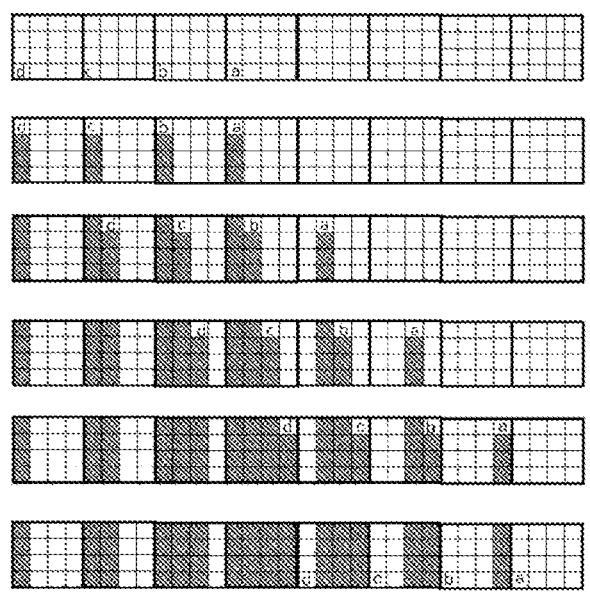
FIG. 4 is a view illustrating an example of a writing operation.
Figure 5:
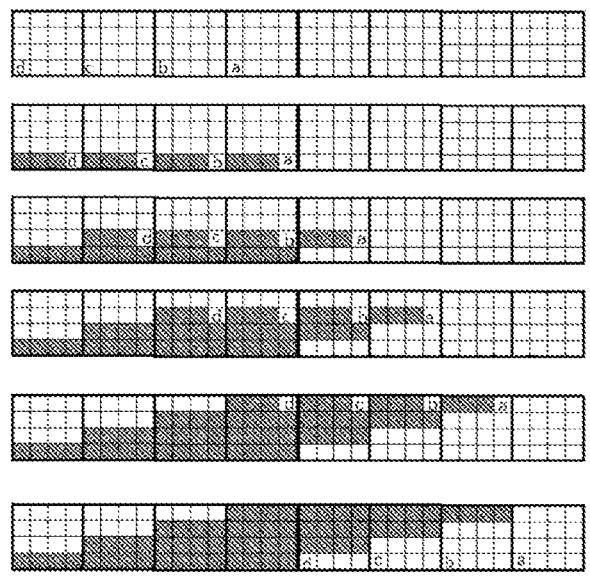
FIG. 5 is a view illustrating an example of a writing operation.
Figure 6:
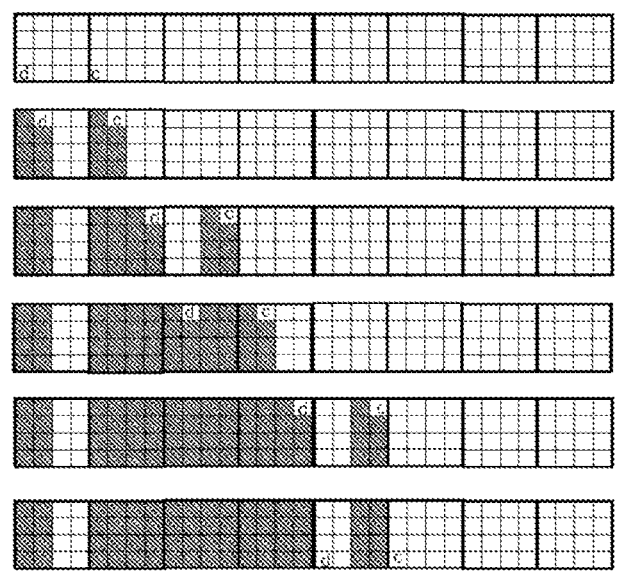
FIG. 6 is a view illustrating an example of a writing operation.

FIG. 4 to FIG. 6 show an example in which four multi-beams are arranged in the x direction, with an interval which is four times the beam size. The multi-beams in four rows or a different number of rows may be present in the y direction in addition, however, the multi-beam in each row performs writing on a region with a height of a beam pitch width, and the beams on some rows, and the pixels to be irradiated are shown in FIG. 4 to FIG. 6, as an example of drawing operation of each line of multi-beam consisting of multiple lines.

The example of FIG. 4 shows repeat of a process for irradiating one column consisting of four pixels in the y direction, then moving the beam in +x direction to move to another column. In FIG. 4, the groups of pixels are partitioned into the regions with the beam pitch width, and when a beam is moved to another column, the beam is moved to a region with another pitch width. Here, only partial pixels are irradiated up to the third region with the pitch width, and all the pixels in further regions with the pitch width on the right are irradiated. In other words, immediately after the start of irradiation, irradiation is incomplete in three beam pitch regions, thus the writing operation is started from a region on the left of the writing region in advance so that actual writing region does not include these regions.

In the example of FIG. 4, the pixels are sequentially irradiated in the y direction. However, without being limited to this, the pixels may be sequentially irradiated in the x direction as shown in FIG. 5, for example. It is also possible to perform irradiation in order other than these.

All the pixels can also be irradiated by using part of the beams arranged in the x direction. One example is shown in FIG. 6. Here, all the pixels are irradiated with two beams c, d by irradiating two columns, then performing an operation of repeat irradiation of a region with another pitch width. In this process, irradiation with other two beams a, b can be performed concurrently with irradiation with the beams c, d. In this case, the pixels irradiated with the beams a, b on the upstream side of a stage movement direction, are irradiated with the beams c, d, thus all the pixels are irradiated twice each. In other words, all the pixels are irradiated twice by dividing the beam array into halves in the x direction and controlling the beam array. In general, all the pixels are irradiated N times or more than N times by dividing the beam array into N parts and controlling the beam array.

Figure 7:
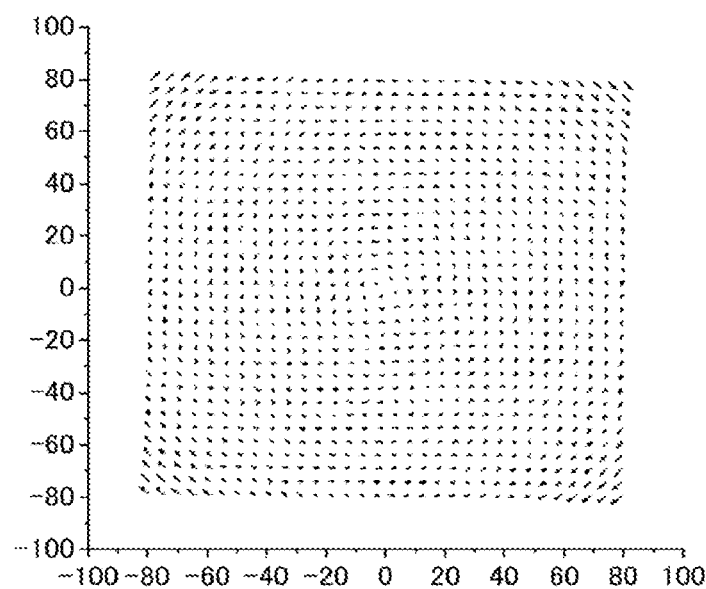
FIG. 7 is a view showing an example of the beam position of each beam in a beam array.

When writing processing is performed, it is ideal that respective beams are irradiated to defined shot positions, that is, the position of the pixel to which each beam corresponds, but actually, the beam irradiation position of each shot is displaced from a defined shot position because of distortion due to distortion of the lens of the electron optical system. FIG. 7 shows an example of distribution of X-coordinate and Y-coordinate for the position displacement amount of each beam on the entire beam array surface irradiated on the substrate 101. In FIG. 7, 32×32 points are arranged as representative points in the multi-beam array, and the positional deviation amount of the beam at each position is shown. Although the position displacement amount is small at the beam array center, the position displacement amount is increased near the periphery of the beam array. In addition, when the range distribution of the position displacement amount is summarized for each Y-coordinate (Yindex: 1 to 32), the result is as shown in FIG. 8, where xmax is a maximum value of signed position displacement amount in the x direction, xmin is a minimum value thereof, ymax is a maximum value of signed position displacement amount in the y direction, and ymin is a minimum value thereof.

Figure 8:
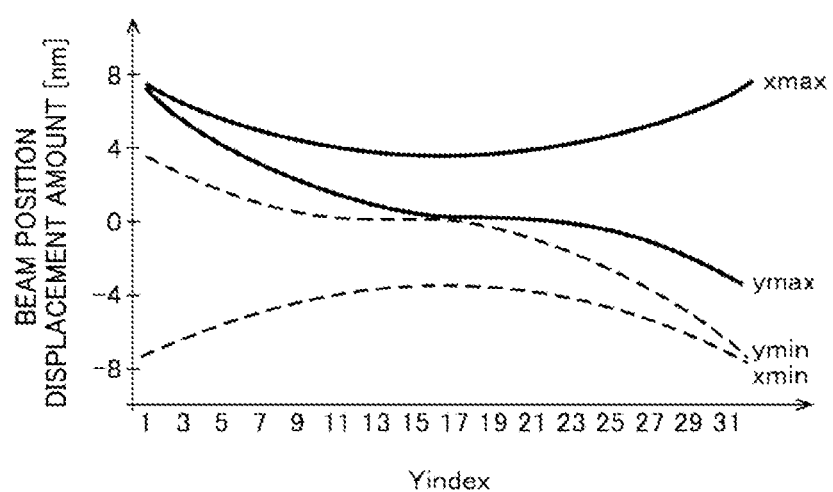
FIG. 8 shows graphs illustrating a beam position displacement amount in a beam array.

As shown in FIG. 8, on the entire beam array surface, the variation (the difference between xmax and xmin, the difference between ymax and ymin) in the beam position displacement amount is slightly small at the central portion (Yindex is around 15 to 17) in the y direction, however, because for any Y-coordinate, the value of a portion at the left end and the right end of the beam array is included, the portion being where the position displacement amount is large, the range of the beam position displacement amount for each Y-coordinate is not necessarily extremely small with respect to the range of the position displacement for the entire bream array.

Figure 9:
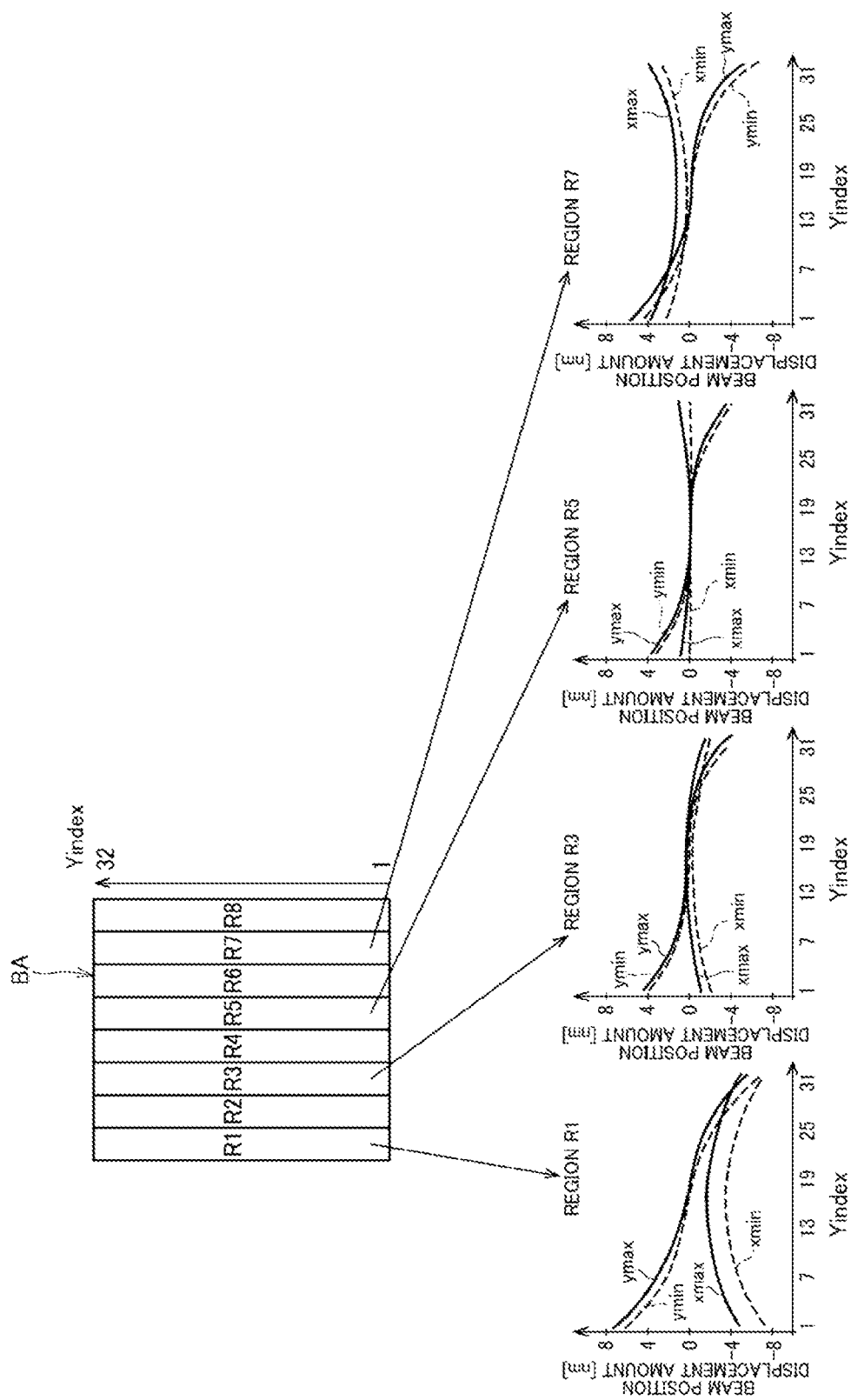
FIG. 9 shows graphs each illustrating a beam position displacement amount in a division region.

In the example of FIG. 7, the beam position displacement gradually changes at least in the x direction systematically, thus as shown in FIG. 9, when a beam array BA is divided into multiple regions, for example, eight regions R1 to R8, in the x direction (the second direction) with a predetermined width, the distribution width of the beam position displacement for each Y-coordinate in each division region is smaller than the distribution width of the beam position displacement for each Y-coordinate in the entire array. This tendency holds even for the Y-coordinates corresponding to the upper and lower beam array, where the beam position displacement is large.

In the embodiment, when position displacement distribution, such as a beam position displacement distribution due to lens distortion, is present which changes gradually in the beam array surface, by utilizing the tendency that the range of the beam position displacement in a partial region of the beam array is smaller than the range of the beam position displacement in the entire beam array, correction of the beam position displacement amount is made, the beam position displacement amount in a partial region of the beam array is uniformly replaced by the average position displacement amount in the region, in other words, the partial region of the beam array is approximated to have an uniform position displacement amount, and position displacement correction of beam is made using an average position displacement amount as a correction amount.

In addition, the beam position displacement amount of one of regions (sub-arrays) into which the beam array is divided is corrected by shifting the position of pattern described in drawing data of a writing pattern drawn by a beam on the region. That is, after shifting the pattern position on the drawing data by the same amount of position correction amount in the direction opposite to the beam position shift amount, using the drawing data, the pattern is drawn by a beam with its position displaced, correction can be made so that the position of the drawing pattern is closer to a design value. Alternatively, the reference position of the process of calculating the dose from the drawing data may be shifted in the opposite direction by the position correction amount.

Figure 10:
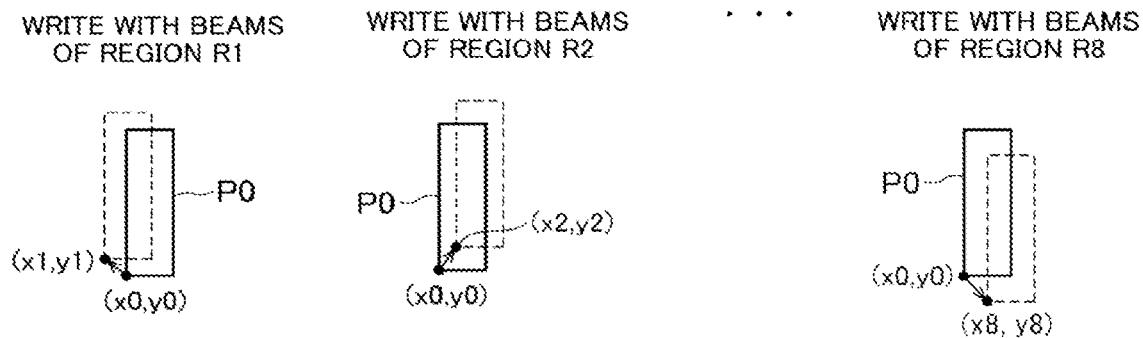
FIG. 10 is a chart showing an example of pattern shift.

For example, as shown in FIG. 10, a pattern P0 having a position on the drawing data (x0, y0) is shifted to a position on the drawing data (x1, y1) according to the beam position displacement amount and the position displacement direction of the region R1, and is written with a beam for the region R1. Also, the pattern P0 is shifted to a position on the drawing data (x2, y2) according to the beam position displacement amount and the position displacement direction of the region R2, and is written with a beam for the region R2. Similarly, although illustration is omitted, the pattern P0 is shifted position on the drawing data according to the beam position displacement amount and the position displacement direction of each of the regions R3 to R7, and is written with a beam for the regions R3 to R7. In addition, the pattern P0 is shifted to a position on the drawing data (x8, y8) according to the beam position displacement amount and the position displacement direction of the region R8, and is written with a beam for the region R8.

While the stage is moved in the x direction, and the beam array passes the position (x0, y0) on the stage, the position is multiply irradiated with the beam for the regions R1 to R8. That is, the pattern P0 is multiply written with a multiplicity equal in number to the region division number of the beam array. Also, slowing the stage speed makes it possible to perform writing for making irradiation once each with a beam for the right half and the left half of each region, for example, the region R1. In this case, the pattern P0 is multiply written with a multiplicity which is twice the region division number of the beam array. In general, the pattern P0 is multiply written with a multiplicity equal to or greater than the region division number of the beam array.

Next, the writing method according to the embodiment will be described with reference to the flowchart shown in FIG. 11.

First, the position displacement amount at the shot position of each beam of multi-beams is measured (step S1). For example, part of the multi-beams is grouped, a mark 106 provided on the XY stage 105 is scanned, and electrons reflected by the mark 106 are detected by the detector 211. The detection circuit 132 notifies the control computer 110 of an amount of electrons detected by the detector 211. The beam position measurement unit 111 obtains a scan waveform from the amount of electrons, and calculates the position of the grouped beams with reference to the position of the XY stage 105. The position of the XY stage 105 has been detected by the stage position detector 139.

Other beams of the multi-beams are grouped, and the position of the beams is calculated by a similar technique. By repeating this, the beam position of each grouped beams can be determined. The difference between the calculated beam position and an ideal position gives the position displacement amount. The obtained position displacement data (map of the position displacement amount) is stored in the memory 142.

It is necessary to select the size of a beam region to be grouped so that the range of the beam position displacement in the region of a grouped beam group is sufficiently smaller than the range of the beam position displacement amount in the entire beam array. That is, when the change in the position displacement amount in the beam array is gradual, a larger beam group region can be used, however, when the change in the position displacement amount is sudden, it is necessary to use a sufficiently small group region. After the position displacement amount for each grouped beams is determined, the position displacement amount is defined as the position displacement amount at the center of the region of the grouped beams, the distribution of the position displacement amount in the beam array is represented, and a position displacement amount at each beam position is calculated by interpolating the distribution.

The division unit 112 divides the beam array into multiple regions (sub-arrays) with an equal width in the x direction (writing movement direction) (step S2). For example, the beam array is divided into eight regions R1 to R8 as shown in FIG. 9.

For each division region, the position displacement amount average value calculation unit 113 calculates average values Xa, Ya of the position displacement amount at X position in the division region for each y-coordinate with an interval $\Delta y$ (step S3). The interval $\Delta y$ is selected so that the change in the position displacement amount dependent on Y-coordinate is sufficiently smaller than the pattern dimensional accuracy and the positional accuracy required for writing. For example, when the required accuracy for dimensional accuracy and positional accuracy is 1.0 nm, it is preferable that the interval $\Delta y$ be set so that the change in the position displacement amount dependent on Y-coordinate is 0.1 nm. For example, when the rate of change in the Y-coordinate of the position displacement amount is 0.2 nm per Y-coordinate 1 um, the $\Delta y$ may be set to 0.5 urn. Xa is the average value of the position displacement amount in the x direction for X position in a region, and Ya is the average value of the position displacement amount in the y direction for Y position in a region. For example, for each of the regions R1 to R8, the average values Xa, Ya of the position displacement amount for each y-coordinate with the interval $\Delta y$ are calculated.

The position correction unit 114 calculates functions $\Delta X(y)$, $\Delta Y(y)$ for the y-coordinate (step S4). The functions $\Delta X(y)$, $\Delta Y(y)$ are functions that represent position correction amounts. Specifically, the functions $\Delta X(y)$, $\Delta Y(y)$ are such that the average values Xa, Ya each with an opposite sign are interpolated for the y-coordinate, thereby generating the function of the y-coordinate. The functions $\Delta X(y)$ and $\Delta Y(y)$ are calculated for each of the divided areas of the beam array. In the example of FIG. 9, the functions $\Delta X(y)$, $\Delta Y(y)$ are calculated for each of the regions R1 to R8, for example. The function data is stored in the memory 144.

The position correction unit 114 reads writing data from the memory 140, and shifts the position of a pattern defined in the writing date by the values of the functions $\Delta X(y)$, $\Delta Y(y)$ (step S5). When the dimension of the writing pattern in the Y direction is large, for example, when the dimension is larger than the $\Delta y$, the pattern is divided with the width of the $\Delta y$ and for each divided pattern, shifting is made with the values of the functions $\Delta X(y)$, $\Delta Y(y)$ corresponding to the x, y coordinates of the divided pattern. When the pattern is divided into a width smaller than the $\Delta y$ in the y direction like this, the position displacement amount inside the pattern can be regarded as substantially the same, thus defining the position x, y of the pattern as the center position of the pattern, or as another position, for example, the lower left position of the pattern yields no difference in the writing accuracy, and the manner how the pattern position is defined causes no degradation in the writing accuracy.

The position correction unit 114 shifts the pattern based on the position correction amount obtained from the position shift amount, the dose calculation unit 115 divides each of the stripe region 34 into mesh shapes in a predetermined size. Here, the relative positions of the pattern and the mesh may be shifted, and the mesh may be shifted. Here, the pixel positions defined on the substrate are not shifted for each sub-array. The position correction unit 114 calculates a pattern area density of the pattern arranged on each divided pixel and an area density map (an area density distribution). The mesh size gives, for example, the average values of the size of a single beam out of multi-beams in the x direction and the y direction. The dose calculation unit 115 calculates the dose of the beam irradiated to each pixel from the pattern area density map. For example, the dose calculation unit 115 multiplies the pattern area density p by a reference dose D0 to calculate an dose pD0 of beam with which each pixel is irradiated (step S6). The dose calculation unit 115 may further modulate the dose. For example, the dose multiplied by a correction coefficient for correcting a proximity effect may be used as the dose. The dose calculation unit 115 generates an dose map that defines the dose for each pixel by the stripe.

After the area density map is created without shifting the relative positions of the mesh and the pattern, the area density map may be shifted based on the position correction amount to generate the dose map. Alternatively, after the dose map is generated from the area density map, the dose map may be shifted based on the position correction amount. Alternatively, in the case where the drawing data is defined by the area density map, the irradiation map may be shifted based on the position correction amount after generating the dose map from the pattern area density map. Alternatively, the position correction may be performed by a combination of two or more shifts of the pattern position, the area density map, and the dose map. Here, the area density map may be generated using the pattern area density p of the pattern defined in the drawing data.

The pattern shift in step S5 and the calculation of the dose of each pixel in step S6 are performed for each division region of the beam array. For example, a pattern is shifted using the functions $\Delta X(y)$, $\Delta Y(y)$ of the region R1, the dose of each pixel in the R1 is calculated by the stripe, and a dose map for the beam of the region R1 is generated. Similarly, the dose map for the beam of each of the regions R2 to R8 is generated by the stripe. Thus, for each of the stripe region 34, dose maps corresponding to R1 to R8 are generated by the stripe.

The data processor 116 converts the dose to an irradiation time, and sorts the irradiation time in a shot order along a writing sequence. The irradiation time is determined as a quotient obtained by dividing the dose for the mesh by the current density of a beam, for example. Since what is obtained by this processing is an irradiation time map by the stripe, a set of meshes to be irradiated with a single shot of multi-beams are selected from the meshes in the map, and irradiation time arrangement data for single shot is generated. Rearranged irradiation time arrangement data is outputted to the deflection control circuit 130.

The deflection control circuit 130 outputs the irradiation time arrangement data to the control circuit of each blanker. The writing controller 117 controls and causes the writer 150 to executes the writing processing described above (step S7). For example, the control circuit of a blanker corresponding to the beam for the region R1 receives input of the irradiation time arrangement data based on the dose map for the region R1. The same goes with other regions R2 to R8.

In this manner, in the embodiment, the beam array is divided into multiple regions with a predetermined equal width in the x direction, and through utilization of the tendency that the range of the beam position displacement in each division region is smaller than the range of the beam position displacement in the entire beam array, for each division region, a function indicating the average value of the position displacement amount is calculated. The position of a pattern defined in the writing data is shifted by the values calculated by the functions, thus correction can be made so that the writing position of a pattern written with a beam with its position displaced is closer to a design value.

In addition, multi-writing is performed with a multiplicity equal to (or greater than) the region division number of the beam array.

The beam position (displacement) correction is made by pattern shift, and in this process, the maximum value of a dose for pixel does not substantially change, thus the writing accuracy can be improved while preventing degradation of the writing throughput. At the time of pattern shift, when patterns or division patterns each divided part of a pattern overlap, the pattern area density p at a position where overlap occurs is increased. However, the difference between the position displacement amounts at adjacent patterns or division patterns is sufficiently small, thus an amount of overlap is small, and the amount of increase in the beam irradiation time due to the overlap is infinitesimal, and the degradation of the writing throughput due to this is also infinitesimal.

Figure 12:
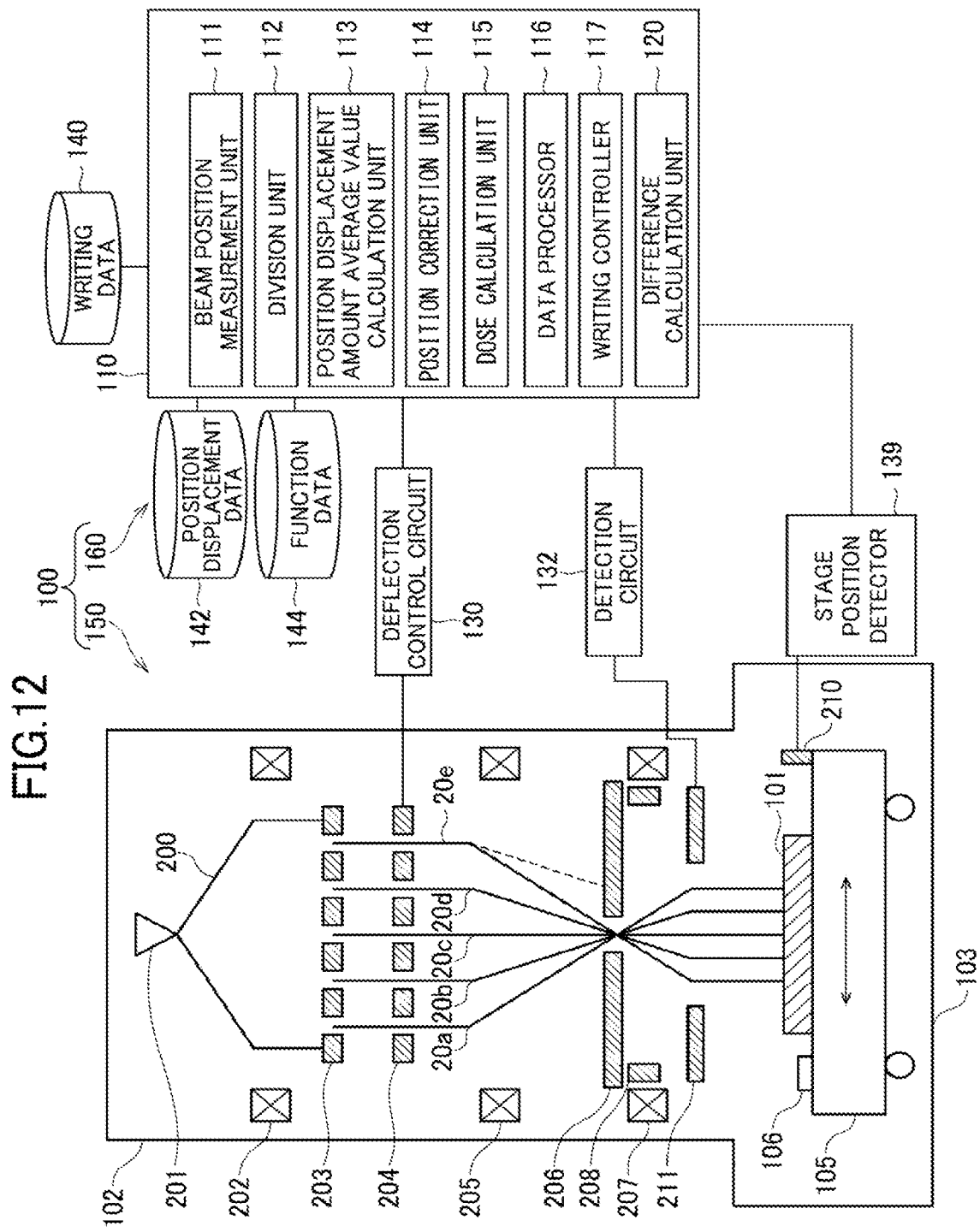
FIG. 12 is a schematic diagram of a multi charged particle beam writing apparatus according to another embodiment.
Figure 13:
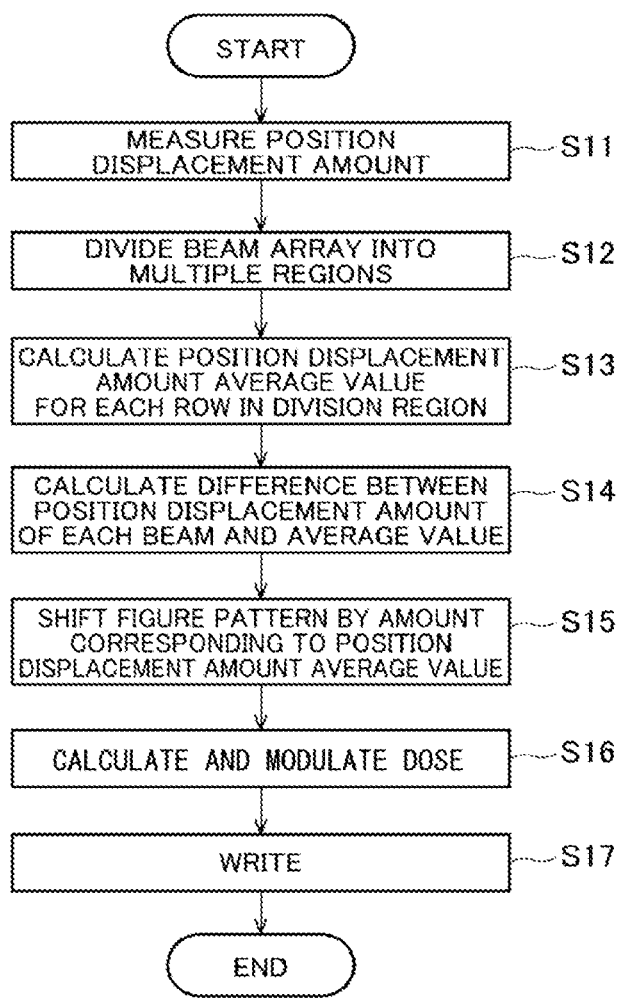
FIG. 13 is a flowchart illustrating a writing method according to another embodiment.

In the embodiment described above, the beam position (displacement) correction is made without performing dose modulation between adjacent pixels. However, the beam position (displacement) correction may be made by combining the pattern shift and the dose modulation between adjacent pixels. In this case, as illustrated in FIG. 12, the control computer 110 further has a difference calculation unit 120 (a difference calculator). A writing method which corrects beam position (displacement) by combining the pattern shift and the dose modulation between adjacent pixels will be described with reference to the flowchart shown in FIG. 13.

Figure 11:
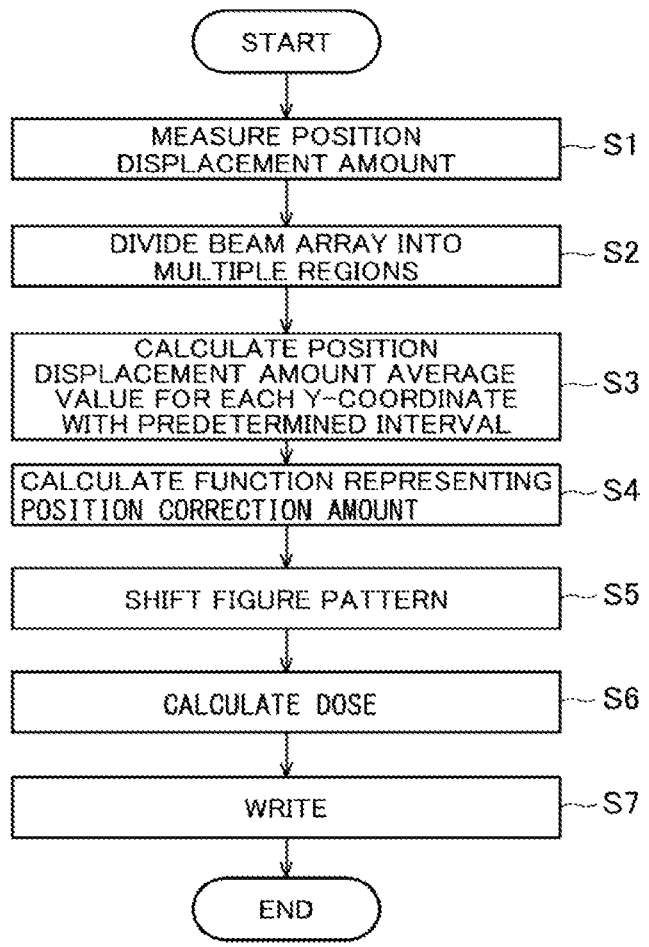
FIG. 11 is a flowchart illustrating a writing method according to the embodiment.

The measurement of the position displacement amount at a shot position (step S11) and the division of region (step S12) are the same processing as in steps S1 and S2 of FIG. 11, thus a description is omitted.

For each division region, the position displacement amount average value calculation unit 113 calculates the average values of the position displacement amounts XA, YA at X position in the division region for each y-coordinate with the interval $\Delta y$ (step S13).

The difference calculation unit 120 calculates the difference X', Y' between the position displacement amounts of each beam and the average values of the position displacement amounts XA, YA at the y-coordinate of each corresponding division region (step S14). That is, when a beam at the position x, y belongs to the division region R2, X', Y' are calculated from the differences between the position displacement amounts XA, YA at the position y in the division region R2 and the x component, y component of the position displacement amounts of the beam.

The position correction unit 114 reads writing data from the memory 140, and shifts the position of a pattern defined in the writing date by –XA, –XY (step S15).

The dose calculation unit 115 divides each of the stripe region 34 into mesh shapes in a predetermined size (for example, the size of a single beam of a multi-beam), and calculates a pattern area density p of a pattern arranged on each divided pixel. The dose calculation unit 115 multiplies the pattern area density p by a reference dose D0 to calculate a dose pD0 of beam with which each pixel is irradiated. The dose calculation unit 115 performs dose modulation between adjacent pixels for the dose pD0 of each pixel based on the above-mentioned differences X', Y' calculated for each beam, and calculates a corrected dose D (step S16). The dose calculation unit 115 generates an dose map that defines an dose for each pixel by the stripe.

Here, the dose map may be generated by shifting the area density map after calculating the pattern area density p of the pattern defined in the writing data to create the area density map. Alternatively, the irradiation map may be shifted after creating the dose map from the pattern area density p of the pattern defined in the writing data.

The pattern shift in step S15 and the calculation and modulation of the dose of each pixel in step S16 are performed for each division region of the beam array. Consequently, for example, a dose map for the beam of each of the regions R1 to R8 is generated.

The data processor 116 converts the dose to an irradiation time, and sorts the irradiation time in a shot order along a writing sequence. Rearranged irradiation time arrangement data is outputted to the deflection control circuit 130.

The deflection control circuit 130 outputs the irradiation time arrangement data to the control circuit of each blanker. The writing controller 117 controls and causes the writer 150 to execute the writing processing described above (step S17).

In this manner, the writing accuracy can be further improved by combining the pattern shift and the dose modulation. Although the writing time becomes longer than in the case where modulation of an dose is not performed as in the embodiment above, the maximum dose per beam can be reduced more than a conventional technique to correct for beam position displacement only by modulation of the dose, thus the writing time can be reduced.

In the embodiment, an example has been described in which the division widths (the widths of the regions R1 to R8) of the beam array are set equal, however, the widths may vary for division regions. For example, the widths of the division regions on the both end sides of the beam array in the x direction may be smaller than the width of the division region at the central portion. This is because even when the division region is made wider, the variation in the position displacement amount is small.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi-beam writing method for irradiating each pixel of a plurality of pixels defined on a substrate, placed on a stage, with each beam of a multi-beam to form a pattern, the method comprising:

obtaining a corresponding position correction amount of the pattern for each of a plurality of sub-arrays, based on a positional deviation amount of each beam of each of the sub-arrays, the plurality of sub-arrays being determined by dividing an array of the multi-beam at least in a predetermined direction, each of the sub-arrays including a plurality of beams;

calculating a dose of the each beam irradiated to each pixel for shifting a position of the pattern drawn for each of the sub-arrays based on the corresponding position correction amount for each of the sub-arrays; and performing multi-writing using at least a portion of each of the sub-arrays with the calculated dose wherein an area density distribution of the pattern corresponding to each of the sub-arrays is obtained, A dose distribution for each of the sub-arrays is obtained from the area density distribution, and the dose distribution is shifted based on the position correction amount, and The dose of each beam with which the pixel corresponding to the pattern is irradiated is calculated.

2. The method according to claim 1, wherein the each beam is irradiated to the pixel corresponding to the pattern, of which the position is shifted on drawing data by shifting the position on the drawing data of the pattern or a reference position of the process of calculating the dose of the each beam from the drawing data for each of the sub-arrays based on the position correction amount for each of the sub-arrays.

3. The method according to claim 1, wherein an area density distribution of the pattern corresponding to each of the sub-arrays is obtained, the area density distribution is shifted based on the position correction amount for the sub-array, and the dose of the each beam with which the pixel corresponding to the pattern is irradiated is calculated.

4. The method according to claim 1, wherein, for each of the plurality of sub-arrays, the corresponding position correction amount is calculated using a function which depends on a position in a direction perpendicular to the predetermined direction in each of the sub-arrays.

5. The method according to claim 1, wherein, for each sub-array of the sub-arrays, the corresponding position correction amount is uniform in the sub-array.

6. The method according to claim 1, wherein a position correction remaining distribution is determined from a difference between a position displacement amount distribution of the beams in each of the sub-arrays and the position correction amount for each of the sub-arrays, and the dose is modulated between adjacent beams based on the position correction remaining distribution.

7. The method according to claim 1, wherein the plurality of sub-arrays have an equal width in the predetermined direction.

8. The method according to claim 1, wherein in the array of the multi-beam, a width in the predetermined direction of sub-arrays located at both ends in the predetermined direction is smaller than a width in the predetermined direction of a sub-array at a central portion.

9. The method according to claim 1, wherein each pixel is irradiated by using a part of the multi-beam array arranged in the predetermined direction.

10. A multi-beam writing apparatus for irradiating each pixel of a plurality of pixels defined on a substrate, placed on a stage, with a beam of a multi-beam to form a pattern, the apparatus comprising:

a position correction circuit obtaining a corresponding position correction amount of the pattern for each of a plurality of sub-arrays, based on a positional deviation amount of each beam for each of the sub-arrays, the plurality of sub-arrays being determined by dividing an array of the multi-beam at least in a predetermined direction, each of the sub-arrays including a plurality of beams;

a dose calculation circuit calculating a dose of the each beam for shifting a position of the pattern to be drawn by each of the sub-arrays based on the corresponding position correction amount for each of the sub-arrays;

a dose controller controlling the each beam of the multi-beam so as to have the calculated dose; and a writer including the stage, irradiating the substrate with the multi-beam, and performing multi-writing on the substrate using at least a portion of each of the sub-arrays with the controlled dose wherein the position correction circuit obtains an area density distribution of the pattern corresponding to each of the sub-arrays, Obtains a dose distribution for each of the sub-arrays from the area density distribution, and shifts the dose distribution based on the position correction amount, and Calculates the dose of each beam with which the pixel corresponding to the pattern is irradiated.

11. The apparatus according to claim 10,
wherein the position correction circuit shifts positions on drawing data of the pattern corresponding to each of the sub-arrays based on the position correction amount,
the dose calculation circuit calculates a dose of the beam with which pixels corresponding to the pattern shifted.

12. The apparatus according to claim 10,
wherein the dose calculation circuit shifts an area density distribution of the pattern for each sub-array by the corresponding position correction amount for the sub-array to obtain a dose distribution for the sub-array, and
calculates the dose of the each beam of the multi-beam.

13. The apparatus according to claim 10,
wherein the dose calculation circuit calculates a dose distribution, and
the position correction circuit shifts the dose distribution based on the position correction amount.

14. The apparatus according to claim 10, wherein, for each sub-array of the sub-arrays, the corresponding position correction amount changes depending on a position in a direction perpendicular to the predetermined direction in the sub-array.

15. The apparatus according to claim 10, further comprising
a difference calculation circuit determining a position correction remaining distribution from a difference between a position displacement amount distribution of the beams in the sub-array and the position correction amount for the sub-array,
wherein the dose calculation circuit modulates the dose between adjacent beams based on the position correction remaining distribution.

16. The apparatus according to claim 10, wherein the plurality of sub-arrays have an equal width in the predetermined direction.

17. The apparatus according to claim 10, wherein in the array of the multi-beam, a width in the predetermined direction of sub-arrays located at both ends in the predetermined direction is smaller than a width in the predetermined direction of a sub-array at a central portion.

* * * * *